(12) United States Patent
Pierret et al.

(10) Patent No.: US 8,618,829 B2
(45) Date of Patent: Dec. 31, 2013

(54) METHOD AND DEVICE FOR DETECTING FAILURE OF EXCITATION CIRCUIT OF POLYPHASE ALTERNATOR

(75) Inventors: Jean-Marie Pierret, Paris (FR); Philippe Masson, Grisy-Suisnes (FR)

(73) Assignee: Valeo Equipements Electriques Moteur, Creteil (FR)

( * ) Notice: Subject to any disclaimer, the term of this patent is extended or adjusted under 35 U.S.C. 154(b) by 502 days.

(21) Appl. No.: 12/515,666

(22) PCT Filed: Nov. 27, 2007
(Under 37 CFR 1.47)

(86) PCT No.: PCT/FR2007/052403
§ 371 (c)(1),
(2), (4) Date: May 4, 2011

(87) PCT Pub. No.: WO2008/074952
PCT Pub. Date: Jun. 26, 2008

(65) Prior Publication Data
US 2012/0161810 A1    Jun. 28, 2012

(30) Foreign Application Priority Data
Dec. 20, 2006  (FR) ...................................... 06 55667

(51) Int. Cl.
*G01R 31/34* (2006.01)
(52) U.S. Cl.
USPC ...... 324/765.01; 324/500; 324/503; 324/509; 324/522; 324/537
(58) Field of Classification Search
USPC ............ 324/765.01, 500, 503, 509, 522, 537, 324/545, 546; 322/99; 361/18, 93.1
See application file for complete search history.

(56) References Cited

U.S. PATENT DOCUMENTS

| | | | |
|---|---|---|---|
| 4,613,808 A * | 9/1986 | Edwards ......................... | 322/99 |
| 5,521,486 A | 5/1996 | Takamoto et al. | |
| 5,701,089 A * | 12/1997 | Perkins .................... | 324/765.01 |
| 6,072,676 A * | 6/2000 | Tran et al. ........................ | 361/56 |
| 6,153,945 A * | 11/2000 | Koss et al. .................... | 307/10.1 |
| 6,377,053 B1 * | 4/2002 | Mazzucco et al. ............ | 324/509 |
| 6,433,519 B2 * | 8/2002 | Taniguchi et al. .............. | 322/28 |
| 6,555,993 B2 * | 4/2003 | Taniguchi et al. .............. | 322/28 |
| 6,798,176 B2 * | 9/2004 | Pierret ............................ | 322/28 |
| 6,803,768 B2 * | 10/2004 | Serratoni et al. .............. | 324/521 |
| 2004/0113593 A1 * | 6/2004 | Aoyama ......................... | 322/28 |
| 2006/0108987 A1 * | 5/2006 | Aoyama ......................... | 322/28 |
| 2007/0210804 A1 * | 9/2007 | Endoh .......................... | 324/522 |

FOREIGN PATENT DOCUMENTS

| DE | 103 37 846 A1 | 3/2005 |
|---|---|---|
| EP | 0 865 143 A2 | 9/1998 |
| FR | 2 642 580 A | 8/1990 |

* cited by examiner

*Primary Examiner* — Jermele M Hollington
*Assistant Examiner* — Adam Clarke
(74) *Attorney, Agent, or Firm* — Berenato & White, LLC

(57) ABSTRACT

The method of detecting the failure of the excitation circuit of a polyphase alternator controlled by a regulator comprises the following steps: a) electrical information (Iexc) is continuously taken from the excitation circuit (1); b) the electrical information taken in step a) is continuously compared with a predetermined threshold value (Iref); c) a logic state (LT) is continuously determined according to the result of the comparison made in step b); and d) if the logic state (LT) determined in step c) persists for a time at least equal to a predetermined delay time (6), an electrical continuity fault of said excitation circuit is signalled. This method is particularly suitable for machines having a rotor equipped with permanent magnets or having a high remanence of the magnetic circuit of the rotor.

9 Claims, 4 Drawing Sheets

US 8,618,829 B2

METHOD AND DEVICE FOR DETECTING FAILURE OF EXCITATION CIRCUIT OF POLYPHASE ALTERNATOR

CROSS-REFERENCE TO RELATED APPLICATIONS AND CLAIM TO PRIORITY

This application relates to International Application No. PCT/FR2007/052403 filed Nov. 27, 2007 and French Patent Application No. 0655667 filed Dec. 20, 2006, of which the disclosures are incorporated herein by reference and to which priority is claimed.

TECHNICAL DOMAIN OF THE INVENTION

The present invention concerns a method and a device for detecting the failure of the excitation circuit of a polyphase alternator. The invention also concerns a polyphase alternator containing this detection device.

TECHNOLOGICAL BACKGROUND OF THE INVENTION

For obvious safety reasons, important items of equipment in a motor vehicle are fitted with devices for detecting and signalling any operational anomaly.

The on-board generator, usually consisting of an alternator with rectified phase voltages, is one of these important items of equipment, and every driver is familiar with the position of the red light marked "charge" on the dashboard of his car.

The widespread use of electronics on board vehicles, often as a replacement for electromechanical components, enables ever-finer detection of operating faults and of the circumstances of breakdowns, for either diagnostic or communication purposes.

For example, the electronic voltage regulator described in patent FR2642580 contains fault-detecting means which analyse the correspondence between various accessible parameters. In this patent application, in particular, the correspondence is analysed between:

the voltage at the output of the alternator and the voltage at the terminals of the field winding;

the voltage at the output of the alternator and the voltage at the terminals of the phase inputs.

The second case allows the following faults to be detected indirectly:

no rotation of the alternator (broken fan belt);

an open excitation circuit (open field winding, brush jammed in its housing, etc.).

According to the teaching of document FR2642580, the following abbreviations are used:

UB: the output voltage of the alternator (or of the battery connected to the alternator).

Un: a desired value.

Up: amplitude of the phase signals.

Vs2: predetermined phase voltage threshold, below which it is assumed that the alternator is unable to charge the on-board network: Vs2<UB LT: state of the charging light (lamp, LED, LCD, etc.), taking the value 0 if no fault is detected (light off), or the value 1 if a fault is detected (light on).

A charging fault is detected when the voltage UB delivered by the alternator is less than the desired value Un when loads are applied, and the amplitude Up of the phase voltage is less than the threshold Vs2 despite the alternator being set to full excitation, i.e. there is the relationship:

If UB<Un and Up<Vs2, then LT=1 (light on).

The method for indirect detection of the failure of the excitation circuit of a polyphase alternator described in the document FR2642580 is, however, not completely satisfactory.

In fact, new alternators often include permanent magnets fixed to the magnetic circuit of the field winding (rotor). These magnets greatly increase the remanent magnetic flux in the alternator.

If there is no excitation current, the phase signals may reach significant amplitudes at high rotation speeds. It is even possible to discharge the alternator without excitation current, which remains acceptable if this discharge remains low enough to be absorbed by the permanent loads present in the vehicle. However, the energy produced by the magnets alone is not sufficient to maintain the voltage in the on-board network when heavy loads are being supplied.

If there is a breakage in the field winding, the drop in amplitude of the phase signals thus does not exist beyond a certain speed of rotation with the magnet rotors.

Consequently: the drop in amplitude of the phase signals cannot be used to detect a continuity fault in the excitation circuit (field winding disconnected, brush jammed in its housing and no longer making proper contact, etc.), because the teaching in document FR2642580 always leads to the relationship:

If UB<Un and Up>Vs2, then LT=0 (light off, no charging fault detected).

GENERAL DESCRIPTION OF THE INVENTION

The present invention is thus aimed at alleviating the disadvantage of this lack of detection.

It specifically concerns a method for detecting the failure of the excitation circuit of a polyphase alternator controlled by a regulator, the method comprising the following steps:

a) electrical information is continuously taken from said excitation circuit;

b) the electrical information taken in step a) is continuously compared with a predetermined threshold value;

c) a logic state is continuously determined according to the result of the comparison made in step b); and d) if the logic state determined in step c) persists for a time at least equal to a predetermined delay time, an electrical continuity fault of said excitation circuit is signalled.

According to another particular characteristic, the electrical continuity fault is only signalled if, as supplementary condition, a command is detected in said regulator to supply a maximum current to said excitation circuit.

According to one particular embodiment, the electrical information taken is an excitation current and the threshold value is a predetermined reference current.

According to another particular embodiment, the electrical information taken is a breakdown voltage of a switching transistor from the excitation circuit and the threshold value is a predetermined reference voltage.

The invention also concerns a device for detecting the failure of the excitation circuit of a polyphase alternator suitable for use of the method described above.

In a first particular embodiment, the device according to the invention is used in an excitation circuit containing a first switching transistor mounted in series with a field winding of the alternator at the terminals of a voltage supply source.

The device is remarkable in that it preferably includes a second transistor mounted in series with a reference current source at the terminals of the voltage supply source. This second transistor serves to mirror the current from the first switching transistor, and delivers a testing current proportional to the excitation current present in the first transistor.

Highly advantageously, the device also includes a resistor and a first peak-clipping diode in series shunted to the terminals of said field winding, a second peak-clipping diode shunted to the terminals of the reference current source, and a circuit for generating said logic state as a function of first and second logic levels present at the terminals of the first and second peak-clipping diodes respectively.

In a second particular embodiment, the device according to the invention is used in an excitation circuit which also contains a switching transistor mounted in series with a field winding of the alternator at the terminals of a voltage supply source.

The device is remarkable in that it preferably includes a voltage comparator, a first input of this comparator being connected to a first terminal common to the field winding and the switching transistor, a second input of the comparator being connected by means of a reference voltage source to a second terminal common to said switching transistor and the supply voltage, and the output of the comparator being connected to a circuit for generating said logic state.

In both particular embodiments of the invention, benefit is derived from the fact that the circuit for generating said logic state contains a delay circuit.

The object of the invention is also a polyphase alternator and an alternator-starter containing a device for detecting the failure of the excitation circuit as previously described.

These few essential specifications will have made obvious to the person skilled in the art the advantages brought by the invention in relation to the prior art.

The detailed specifications of the invention are given in the description which follows, in conjunction with the drawings appended hereto. It should be noted that these drawings are intended merely to illustrate the text of the description and do not in any way constitute a limitation of the scope of the invention.

Figure 1:
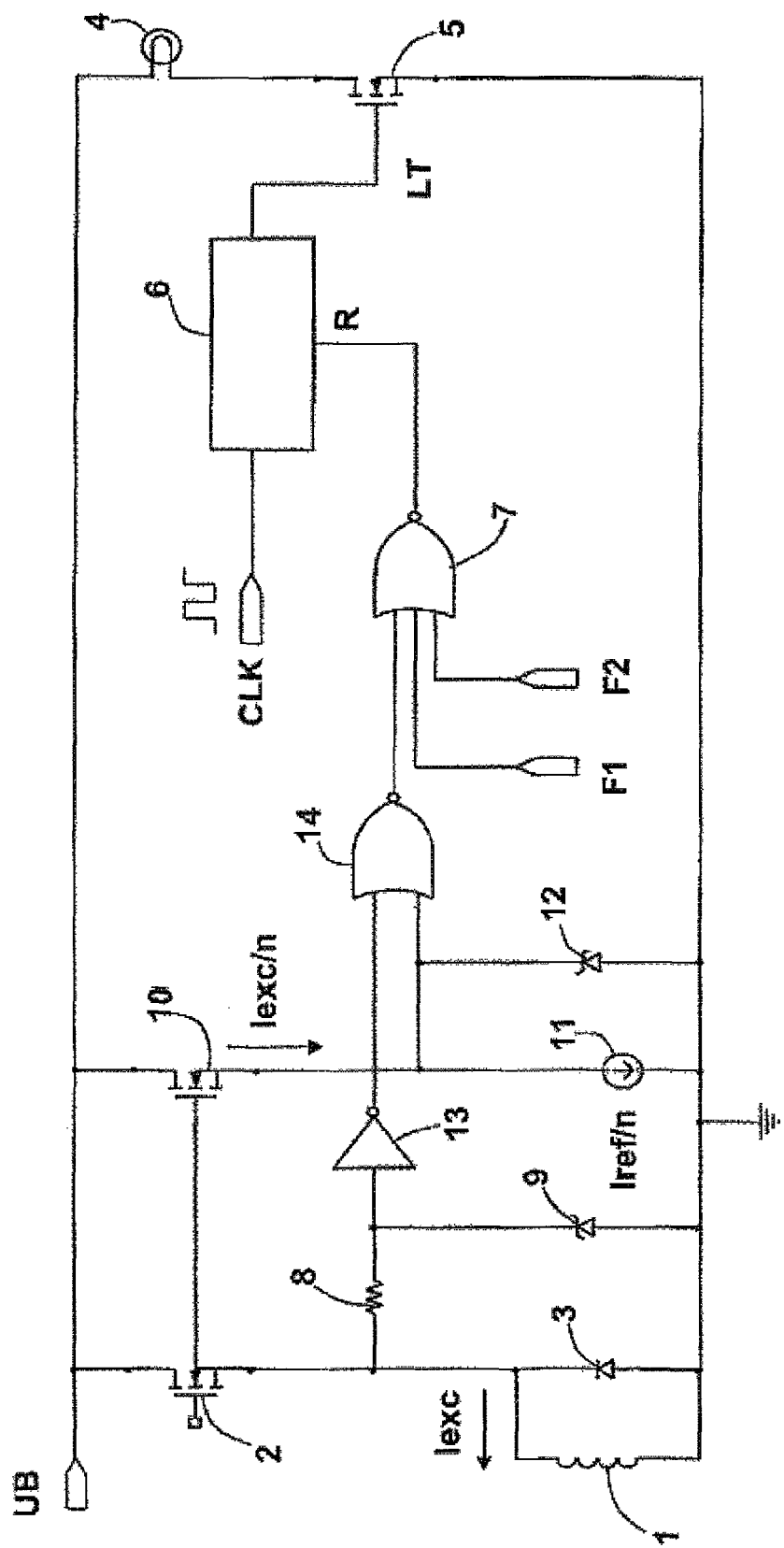
FIG. 1 is the skeleton diagram of the first embodiment of the device for detecting the failure of the excitation circuit of a polyphase alternator according to the invention.

DESCRIPTION OF PREFERRED
EMBODIMENTS OF THE INVENTION

If the magnetic circuit of an alternator contains permanent magnets, or else presents a high remanence, it is thus impossible to detect a failure of the excitation circuit indirectly via the absence of phase signals.

The solution to this problem consists in noting that if there is a breakage of the excitation circuit, the output voltage of the alternator falls when loads are applied. The regulator then goes into full excitation mode in order to supply a predetermined maximum excitation current Imax, for example 5 A.

In these conditions, it is sufficient to measure the value of the excitation current or the breakdown voltage of the transistor powering the field winding, and to compare it to predetermined threshold values:

a) If the excitation current is strong, or if the breakdown voltage is high, the field winding has not been disconnected.

b) If the excitation current is zero, or if the breakdown voltage is low, the field winding has been disconnected.

This fault detection mode is an addition to the modes already in use in an existing regulator, such as that described in the document FR2642580, and does not replace them.

The method according to the invention is based on the addition of a logical relationship which involves the level of the excitation current or the breakdown voltage of the power transistor supplying the field winding and the level of the output voltage UB in relation to the desired voltage Un.

Preferably, the new logical relationship has the following arguments:

UB: rectified output voltage of the alternator (or voltage of the battery connected to the alternator);
Un: desired voltage of the regulator,
Iexc: excitation current;
Iref: predetermined reference current, i.e. a predetermined excitation current threshold below which it is assumed that the excitation circuit is open when UB<Un;
LT: logic state of a signal for detecting the failure of the excitation circuit, or state of the charging light (lamp, LED, LCD, etc.), taking the values:

LT=0 if no fault is detected (the light is off);

LT=1 if a fault is detected (the light is on).

The condition of detection of an open excitation circuit is realised in this case by a simple logic OR:

TABLE 1

|  | UB | |
| --- | --- | --- |
| Iexc | UB < Un | UB > Un |
| Iexc < Iref | LT = 1 | LT = 0 |
| Iexc > Iref | LT = 0 | LT = 0 |

Alternatively, if the regulator does not contain means of measuring the excitation current Iexc, the same result is obtained by measuring the breakdown voltage of the excitation transistor.

So:

Von: breakdown voltage of the excitation transistor in full excitation state.
Vref: predetermined threshold of Von below which it is assumed that the excitation circuit is open when UB<Un.

In this case, the logic state LT of the detection signal is then determined by the relationship:

TABLE 2

|  | UB | |
| --- | --- | --- |
| Von | UB < Un | UB > Un |
| Von < Vref | LT = 1 | LT = 0 |
| Von > Vref | LT = 0 | LT = 0 |

The detection of the drop in the battery voltage (i.e. when UB<Un) is provided by the field winding being set to full excitation state.

The delay present in the fault detection circuits of an existing regulator, such as that described in the document FR2642580, performs this detection naturally (in the order of 300 ms). This delay only detects faults confirmed to be of a duration greater than the duration of this delay and for which the disconnection of the excitation has disappeared. If there is a fault, the regulator remains in a fixed stable state, which is the case when the field winding is disconnected (full excitation state).

FIG. 1 represents a first embodiment of a device for detecting the failure of the excitation circuit of a polyphase alternator according to the invention, using the method consisting of measuring the excitation current Iexc (Table 1).

In the manner known in the art, the field winding 1 of the alternator is supplied from the battery voltage US by power electronics containing a first switching transistor 2 and a recovery diode 3.

In equally known fashion, faults other than the failure of the excitation circuit are signalled by a charging light 4, one terminal of which is connected to the battery voltage UB, and the other terminal of which is switched to earth by a transistor 5 controlled by the output signal of a delay circuit 6.

The delay circuit 6, which preferably delivers a delay of 300 ms, is triggered by the output signal of a first NOT-OR circuit 7, the inputs of which receive logic levels F1, F2 representing the diverse faults of the alternator, and of the associated power electronics.

In addition to these known elements, shunted to the terminals of the field winding 1 are a resistor 8 in series with a first Zener diode 9. This first peak-clipping diode 9 limits the excitation signal to logic levels (for example: 5 V).

A second transistor 10 has also been added. It serves to mirror the first switching transistor 2 by delivering a low current Iexc/n, but which is proportional to the excitation current Iexc.

If Iexc=5 A and n=100, the current Iref/n delivered by the second transistor 10 is equal to 50 mA, which corresponds to a full excitation state with a field winding in good condition. If the field winding 1 is disconnected, the value of Iexc/n falls to a value equal to zero, or close to zero.

The disconnection of the field winding 1 is detected by comparing the current Iexc/n to a reference current source 11 fixed at an intermediate value (for example: Iref/n=25 mA). A second Zener diode 12 fixes the amplitude of the voltage at the terminals of the reference current source 11 so that it is compatible with the logic levels (for example: 5 V).

A detection signal LT of the failure of the field winding 1 is generated from a first logic level present at the anode of the first Zener diode 9, and from a second logic level present at the anode of the second Zener diode 12.

The first logic level is applied at the input of an inverse gate 13, the output of which is connected to an input of a second NOT-OR gate 14; the second logic level is applied at another input of this second NOT-OR circuit 14. The output of the second NOT-OR gate 1 is connected to an input of the first NOT-OR gate 7.

In normal regulation, the disconnection of the first switching transistor 2 is such that the input of the inverse gate 13 changes to logic levels 0 and 1, Iexc/n is less or changes to either side of the reference value Iref/n, and the levels of the inputs of the second NOT-OR gate 14 produce a level 0 as output (or a succession of levels 0 and 1).

Consequently, the output of the first NOT-OR gate 7 remains at level 1 or changes successively to logic levels 0 and 1. The delay circuit 6 is continuously reinitialised, and no fault is detected.

When the voltage UB at the output of the alternator falls and the field winding 1 is not disconnected, the first switching transistor 2 is at full excitation, but Iexc/n is still greater than the reference value Iref/n, while the second logic level and the corresponding input of the second NOT-OR gate 14 are still at level 1, with the result that its output remains at level 0.

If no other faults are detected at logic levels F1 and F2, the corresponding input of the first NOT-OR gate 7 remains at level 1, and the delay circuit 6 is inhibited: no fault is detected.

If the field winding 1 is disconnected, the regulator attempts to set full excitation, the input of the inverse gate 13 changes to level 1 and its output changes to level 0. On the other hand, the voltage at the terminals of the reference current source 11 falls to earth potential (level 0). The output of the second NOT-OR gate 14 thus changes to logic level 1, and the output of the first NOT-OR gate 7 therefore changes to level 0.

If the disconnection of the field winding 1 is confirmed, the output of the first NOT-OR gate 7 is maintained at level 0, as is the reset input R of the delay circuit 6. Consequently, the delay circuit 6 is triggered, and its output changes to level 1 after 300 ms.

The control transistor 5 of the charging light 4 is then switched on, the result of which is to signal the failure of the field winding 1.

Figure 2:
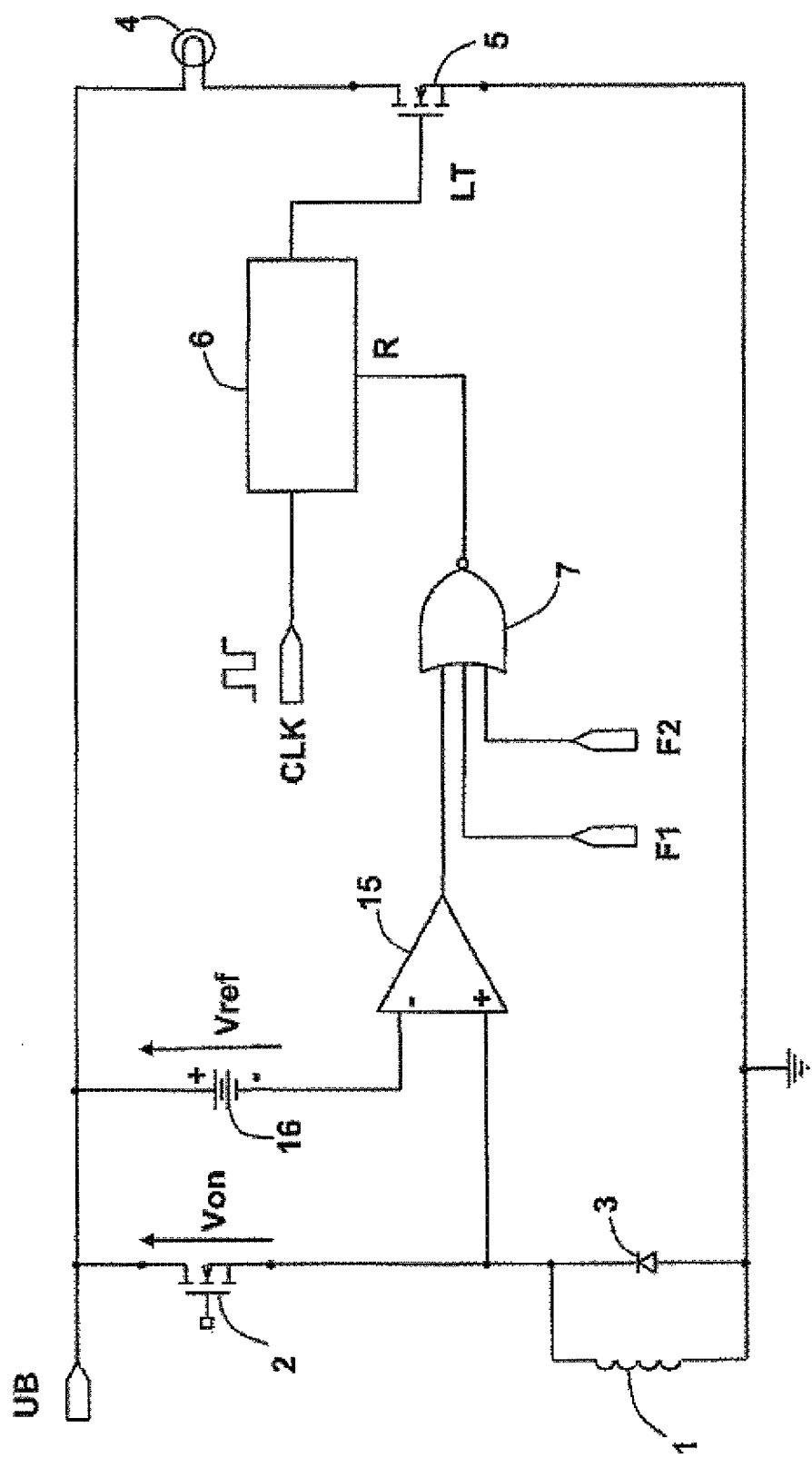
FIG. 2 is the skeleton diagram of the second embodiment of the device for detecting the failure of the excitation circuit of a polyphase alternator according to the invention.

A second embodiment of a device for detecting the failure of the excitation circuit of a polyphase alternator according to the invention is shown in FIG. 2. This second embodiment uses as an alternative the method consisting of measuring the breakdown voltage of the switching transistor 2 of the excitation circuit (Table 2).

The same elements already used in the first embodiment are found here, i.e.:
a field winding 1;
a switching transistor 2;
a recovery diode 3;
a charging light 4;
a transistor 5 which switches this charging light in relation to a fixed potential (earth);
a NOT-OR gate 7 taking into account all the faults F1, F2 detected by the specific means internal to the regulator.
a delay circuit 6.

In addition to these elements, the fitting of a voltage comparator 15 enables the breakdown voltage Von of the switching transistor 2 to be compared to a reference voltage Vref of a reference voltage source 16.

When the regulator is at full excitation, and the excitation current is at its maximum, the breakdown voltage Von is high (for example: 200 mV).

If the field winding is disconnected, the regulation loop tries to order the supply of a maximum excitation current Imax. As this maximum excitation current Imax cannot be delivered, the breakdown voltage Von remains zero or close to zero.

It is sufficient to select a value of Vref between these two values, for example 50 mV, to detect a disconnection of the field winding 1.

One advantage of this second embodiment over the first embodiment is that the combination of the switching transistor 2 and of the voltage comparator 15 allows direct detection of the disconnection of the field winding 1 without the need for another NOT-OR gate.

In normal regulation, the disconnection of the switching transistor 2 is such that Von is alternately less than and greater than the reference voltage Vref; consequently, the outputs of the voltage comparator 15 and of the NOT-OR gate 7 change successively to logic levels 0 and 1. The delay circuit 6 is continuously reinitialised, and no fault is detected.

When the output voltage UB of the alternator falls, and the field winding 1 is not disconnected, the switching transistor 2 is at full excitation, the breakdown voltage Von is greater than 50 mV, the output of the voltage comparator 15 is at logic level 0, the output of the NOT-OR gate 7 is at level 1, and the delay circuit is inhibited: there is no fault detected.

If the field winding is disconnected, the output voltage UB of the alternator falls, the switching transistor 2 is at full excitation, but the breakdown voltage Von is less than 50 mV and the output of the voltage comparator 15 is at logic level 1. The fault is detected after the delay of 300 ms imposed by the delay circuit 6.

In order to illustrate the functioning of the devices described above, FIGS. 3, 4, 5 and 6 represent the logic state of the detection signal LT, or of the charging light, as a function of the excitation current Iexc in different modes of operation of the alternator.

Figure 3:
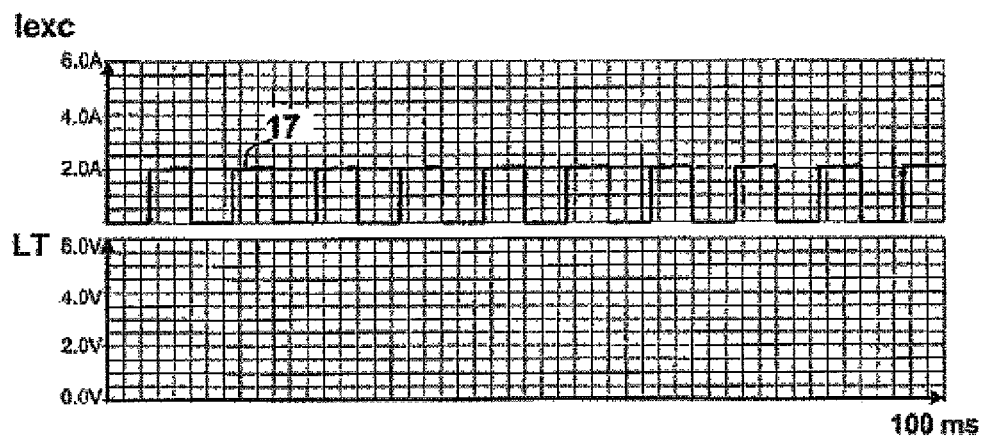
FIG. 3 represents a timing diagram of the excitation current in normal mode and of the detection signal in the absence of any failure of the excitation circuit.

FIG. 3 shows, in normal alternator operating mode, the waveform 17 of the excitation current Iexc, the amplitude and the cyclic ratio being determined by the regulation loop. In this mode, the cyclic ratio is less than 1, and the intensity of the excitation current Iexc remains less than the maximum intensity Imax.

The detection signal LT of a failure of the field winding remains at logic level 0.

Figure 4:
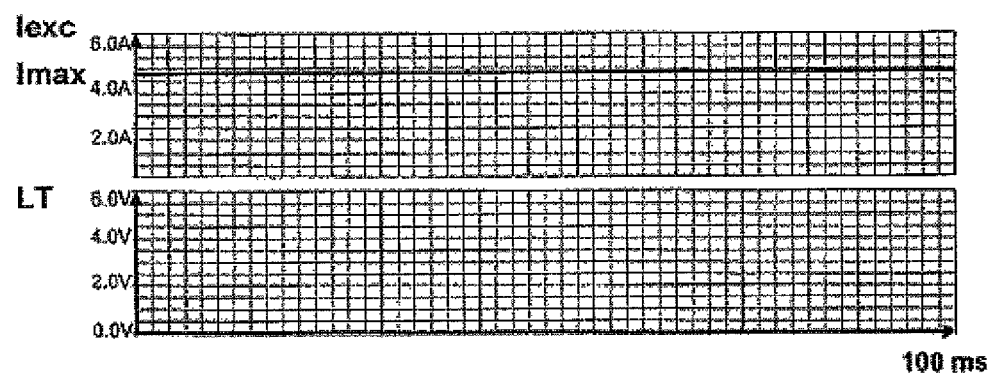
FIG. 4 represents a timing diagram of the excitation current in full excitation mode and of the detection signal in the absence of a failure of the excitation circuit.

FIG. 4 shows the situation where the excitation current Iexc is direct and at maximum intensity Imax, i.e. the situation where the regulator has received a "full excitation" command. The detection signal LT remains at logic level 0, i.e. the excitation circuit is in good condition, and the alternator is effectively in full excitation mode.

Figure 5:
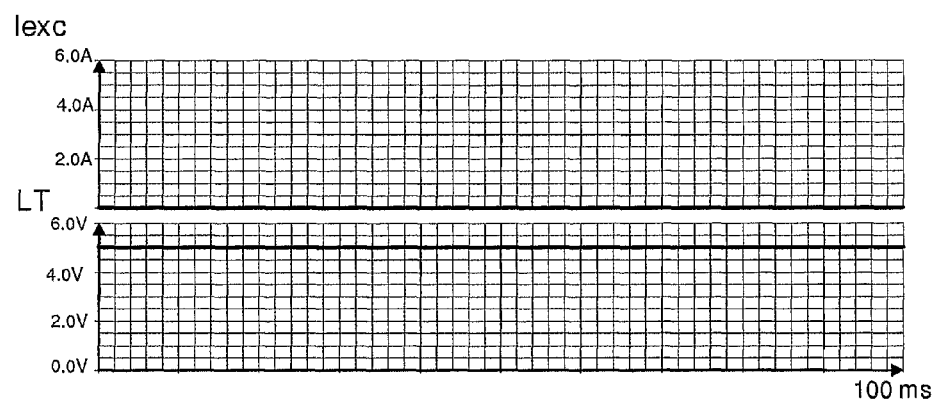
FIG. 5 represents a timing diagram of the excitation current following a "full excitation" command and the detection signal in the case of a failure of the excitation circuit.

FIG. 5 shows the situation in which the field winding 1 is disconnected. The regulator has received a "full excitation" command, but the excitation current Iexc is zero.

The detection signal LT of a failure of the field winding is at logic level 1.

Figure 6:
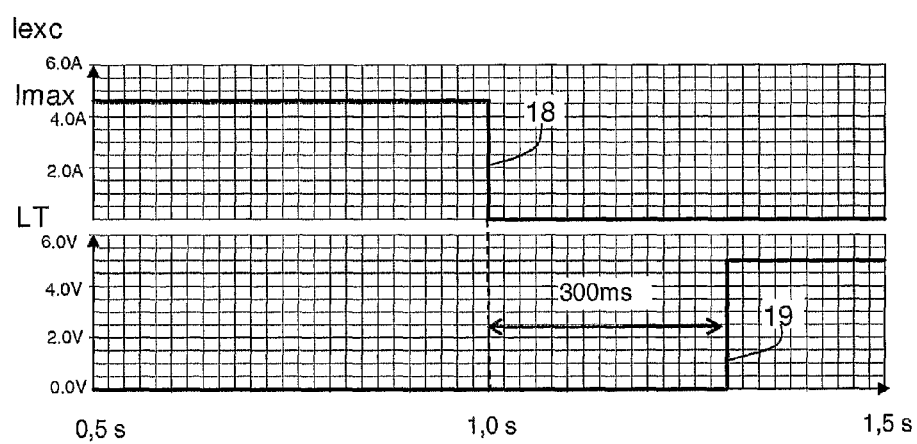
FIG. 6 represents a timing diagram of the excitation current following a "full excitation" command and of the detection signal at the moment of failure of the excitation circuit.

As clearly shown by FIG. 6, the delay circuit 6 triggers a delay of 300 ms between the moment 18 of the interruption of the field winding 1 and the moment 19 when the detection signal LT goes to logic level 1.

Obviously, the invention is not limited merely to the preferred embodiments described above.

In particular, the specific values of the intensities, voltages and the delay specified above are given only by way of examples.

The same applies to the particular types of discrete elements, the analogue or logic circuits cited: they could, as a variant, be replaced by other electronic components performing the same functions.

The invention thus covers, on the contrary, all possible variants of realisation which would remain within the scope defined by the following claims.

The invention claimed is:

1. A method for detecting the failure of an excitation circuit of a polyphase alternator controlled by a regulator, said method comprising the following steps:
   a) continuously taking electrical information (Iexc; Von) other than a phase signal from said excitation circuit;
   b) continuously comparing said electrical information taken in step a) with a predetermined threshold value (Iref, Vref);
   c) continuously determining a logic state (LT) according to the result of the comparison made in step b); and
   d) signalling an electrical continuity fault of said excitation circuit if said logic state (LT) determined in step c) persists for a time at least equal to a predetermined delay time (6);
   said electrical information taken being an excitation current (Iexc) and said predetermined threshold value being a predetermined reference current (Iref).

2. The method according to claim 1, wherein the polyphase alternator has a rotor with permanent magnets or a rotor having a high remanence of a magnetic circuit thereof, and wherein said electrical continuity fault is only signalled if, as a supplementary condition, a command is detected in said regulator to supply a maximum current (Imax) to said excitation circuit.

3. A device for detecting the failure of an excitation circuit of a polyphase alternator according to claim 1, said excitation circuit comprising:
   a first switching transistor (2) mounted in series with a field winding (1) of said alternator at the terminals of a supply voltage source (UB); and
   a second transistor (10) mounted in series with a reference current source (11) at the terminals of said supply voltage source (UB);
   said second transistor (10) serving to mirror the current from said first switching transistor (2), and delivering a testing current (Iexc/n) proportional to said excitation current (Iexc) present in said first transistor.

4. The device for detecting the failure of an excitation circuit of a polyphase alternator according to claim 3, wherein said device also includes a resistor (8) and a first peak-clipping diode (9) in series shunted to the terminals of said field winding (1), a second peak-clipping diode (12) shunted to the terminals of said reference current source (11), and a gate (6, 7, 13, 14) generating said logic state (LT) as a function of first and second logic levels present at the terminals of the first and second peak-clipping diodes (9, 12) respectively.

5. The device according to claim 4, wherein said gate (6, 7, 13, 14) for generating said logic state contains a delay circuit (6).

6. A polyphase alternator comprising a device for detecting the failure of the excitation circuit according to claim 3.

7. An alternator-starter comprising a device for detecting the failure of the excitation circuit according to claim 3.

8. A method for detecting the failure of an excitation circuit of a polyphase alternator controlled by a regulator said method comprising the following steps:
   e) continuously taking electrical information (Iexc; Von) other than a phase signal from said excitation circuit;
   f) continuously comparing said electrical information taken in step a) with a predetermined threshold value (Iref, Vref);
   g) continuously determining a logic state (LT) according to the result of the comparison made in step b); and
   h) signalling an electrical continuity fault of said excitation circuit if said logic state (LT) determined in step c) persists for a time at least equal to a predetermined delay time (6);
   said electrical information taken being a breakdown voltage (Von) of a switching transistor (2) of said excitation circuit and said threshold value being a predetermined reference voltage (Vref).

9. A device for detecting the failure of an excitation circuit of a polyphase alternator suited to the implementation of the method according to claim 8, said excitation circuit comprising a switching transistor (2) mounted in series with a field winding (1) of said alternator at the terminals of a supply voltage source (UB), said device including:
- a voltage comparator (15);
- a first input of said voltage comparator (15) being connected to a first terminal common to said field winding (1) and to said switching transistor (2); and
- a second input of said voltage comparator (15) being connected by means of a reference voltage source (16) to a second terminal common to said switching transistor (2) and to said supply voltage (UB);
- an output of said voltage comparator (15) being connected to a gate (6, 7) for generating said logic state (LT).

* * * * *